United States Patent [19]

Huschka et al.

[11] 4,128,075
[45] Dec. 5, 1978

[54] APPARATUS FOR COATING FUEL FERTILE OR ABSORBER MATERIAL CONTAINING PARTICLES FOR HIGH TEMPERATURE FUEL ELEMENTS

[75] Inventors: Hans Huschka; Wolfgang Warzawa, both of Grossauheim, Germany

[73] Assignee: HOBEG Hochtemperaturreaktor-Brennelement G.m.b.H, Grossauheim, Germany

[21] Appl. No.: 782,509

[22] Filed: Mar. 29, 1977

Related U.S. Application Data

[62] Division of Ser. No. 500,017, Aug. 23, 1974, Pat. No. 4,056,641.

[30] Foreign Application Priority Data

Aug. 27, 1973 [DE] Fed. Rep. of Germany ....... 2343123

[51] Int. Cl.² .......................... C23C 13/08; G21C 3/14
[52] U.S. Cl. ................................... 118/49.1; 118/303; 118/DIG. 5; 176/91 SP; 427/6; 427/213
[58] Field of Search ................ 118/DIG. 5, 49.1, 303, 118/48; 427/6, 213; 252/301.1 W; 176/91 SP

[56] References Cited

U.S. PATENT DOCUMENTS

| | | | |
|---|---|---|---|
| 2,786,801 | 3/1957 | McKinley et al. | 427/213 |
| 3,205,042 | 9/1965 | Jacobson | 427/213 |
| 3,361,638 | 1/1968 | Bokros et al. | 427/6 |
| 3,382,093 | 5/1968 | Nack | 427/213 |
| 3,457,334 | 7/1969 | Horsley | 427/213 |
| 3,547,676 | 12/1970 | Bokrus et al. | 427/213 |
| 3,619,241 | 11/1971 | Guedell | 176/91 SP |
| 3,687,717 | 8/1972 | Philip | 427/213 |
| 3,687,717 | 8/1972 | Philip | 18/303 X |
| 3,764,469 | 10/1973 | Bokros | 427/6 |
| 3,799,790 | 3/1974 | Schulz et al. | 427/6 |
| 3,822,140 | 7/1974 | Gyarmati et al. | 427/6 |

*Primary Examiner*—Louis K. Rimrodt
*Attorney, Agent, or Firm*—Cushman, Darby & Cushman

[57] ABSTRACT

Fuel, fertile material or absorber material containing particles for high temperature fuel elements are coated in a fluidized bed by heating the particles and fluidizing through carrier gas preheated to the desired temperature. The coating gas, having a higher velocity than the carrier gas causing fluidizing, is blown into the fluidized particle bed from one or more nozzles from above counter to the flow of the carrier gas. The nozzles end above the fluidized layer.

5 Claims, 4 Drawing Figures

APPARATUS FOR COATING FUEL FERTILE OR ABSORBER MATERIAL CONTAINING PARTICLES FOR HIGH TEMPERATURE FUEL ELEMENTS

This is a division, of application Ser. No. 500,017 filed Aug. 23, 1974 now U.S. Pat. No. 4,056,641.

The present invention is directed to an apparatus and process for coating fuel, fertile or absorber material containing particles for high temperature fuel elements in a fluidized bed.

Fuel elements for high temperature reactors generally consist of carbon as the structural material in which there is introduced the fuel and fertile materials in the form of coated particles. These coated particles are spherical small particles of carbides and/or oxides of fuel and/or fertile materials, especially of uranium and thorium, also called heavy metal kernels which are coated with layers of pyrolytic carbon, sometimes also with layers of silicon carbide (J. L. Kaal, Journal of Nuclear Materials, Vol. 29, pages 249-266 (1969)).

The production of the coated particles generally takes place by coating the heavy metal kernels in fluidized bed units. For this purpose the kernels are heated at a high temperature in a vertically standing graphite tube which is closed at the bottom with a conical or flat shaped perforated or fritted bottom. Carrier gas, usually argon is blown in through the bottom and so the particle charge is held in motion. The hydrocarbon gas necessary for the coating is sometimes directly blown in through holes in the bottom of the bed, but is usually introduced through water cooled nozzles, which are fitted into the bottom of the bed. The hydrocarbon is pyrolytically decomposed in the hot fluidized layer of the heavy metal kernels whereby the carbon is deposited as a layer on the particles and the hydrogen is removed with the waste gas (P. Koss, Ber. d. Deutschen Keramischen Ges., Vol. 43 (1966), No. 3, pages 199-258).

Although these fluidized bed plants have been developed up to the point of production, there occur in practice considerable difficulties which strongly affect the quality of the particle coating, the susceptibility to disturbances in the plant and the carrying out of the process. In order to understand these difficulties in maintaining quality, it must be pointed out that the task of the coatings is to retain the fission products, wherefor they must completely inclose the fuel and fertile material. This means that no uncoated particles can be present and the quality of all coatings must be so good that no fuel can be set free through diffusion and no coating destroyed during the operation of the reactor. The quality of the coating therefore is rigorously specified in thickness, density, anistropy, structure and polygonity. Therefore, the coatings of the individual particles and therewith the coating conditions for the individual particles must be equal.

These conditions can only be fulfilled to a limited extent with the fluidized beds employed up to the present. The basis for this is that the coating gas must be introduced into the fluidized layer at a temperature below the decomposition temperature, since otherwise the inlet openings become clogged. With water cooled nozzles the temperature at the gas inlet is less than 100° C., the coating conditions for the individual particles, according to the position of these particles in the fluidized layer, continuously change. Besides, depending on the flow conditions and the decomposition speed of the hydrocarbon gas which is dependent on the prevailing temperature, there is also built up a concentration gradient.

The properties of the coating on an individual particle also depends very strongly on the residence time of this particle in the individual zones of the fluidized layer and therewith also the flow and motion behaviour of the particle bed.

Furthermore, in spite of cooling of the inlet for the coating gas, a favorable design of the geometry of the bed bottom and the use of multiple or ring nozzles for the directed introduction of coating and carrier gas there is not successfully excluded with certainty growth or separation of pyrolytic carbon on the bed walls and gas inlet. Two types of growths are especially noticeably disadvantageous; plugs or nozzle shaped growths directly at the gas inlet, which can be from several millimeters to several centimeters long, lead to a changed bed motion and through this to small quiet zone in which the individual uncoated and poorly coated particles are found. A second type of carbon separation is found on the bed walls where the carbon is deposited more or less evenly and because of thermal stresses partially cracks. In the cracks and gaps, particles accumulate which become removed from the further coating, however, are removed in the discharging of the bed. These two examples are chosen at random from a large number of possible disturbances all of which can vary from charge to charge and lead to different charge qualities or also to waste.

These undesired carbon separations in the plant also make it necessary to overhaul the fluidized bed plant after one charge or a few charges in a time consuming and expensive manner, to redo the graphite installations or to add new parts. The reconstruction of this type of construction with its complicated cooled bed bottom and nozzles is very troublesome. Because of these necessary cleaning and reconstruction operations the industrial feasibility of carrying out the process is clearly limited.

For industrial and technical reasons it would be desirable to load the heavy metal particles into the hot plant, after the coating takes place to discharge the particles from the hot bed and to load the next charge without cooling the plant, whereby both the long heating and cooling times as well as energy can be saved. However, for the reasons mentioned above, this can be done to only a limited extent with the processes known at the present time.

The difficulties mentioned in the coating of fuel, fertile or absorber material containing particles for high temperature fuel element in a fluidized bed are overcome according to the invention by heating to a constant temperature without gradient the particle bed brought to fluidization by inert carrier gas and blowing the coating gas from above through a nozzle, whose temperature is held below the decomposition temperature of the coating gas, into the charge whereby the nozzle ends above the fluidized layer. The strong heat transfer over bed walls and fluidized layer to the nozzles standing in direct contact therewith, which transfer occurs according to conventional coating is reduced according to the invention to the negligible radiation portion from the bed surface to the small area of the well insulated nozzle. The coating gas must leave the nozzle with such speed that it penetrates against the carrier gas stream up to the particle charge and there leads to a coating of the particles.

The process of the invention has to overcome the prejudice that the coating gas already becomes destroyed in the gas phase and no coating takes place on the particles. Also, it was assumed that a large part of the coating gas is discharged through the counter flowing carrier gas so that there could only be expected a very small speed of growth.

Contrary to all of these expectations, it has been found that according to the process of the invention, the desired coating quality can be produced with the customary speed of growth.

The movement of the particles in the particle bed can be so regulated by different cross-sections and direction of gas inlet openings that the coating process comes out optimal. As carrier gas for the fluidization of the particles there are generally used argon, helium, nitrogen, hydrogen, or carbon monoxide individually or as a mixture.

It is especially advantageous to carry out the coating process of the present process, not at normal pressure (atmospheric pressure), but instead under reduced pressure. Thus, the pressure can range from atmospheric pressure to as low as 50 Torr, and is preferably 200 to 500 Torr. As coating gases there can be used hydrocarbons and/or silanes, especially acetylene, propylene or methane. Other hydrocarbons include, for example, ethylene, ethane and propane. As silanes there can be used for example monosilane and disilane or monomethyl trichlorosilane. This coating gas can also be diluted with an inert gas such as any of the carrier gases mentioned above for example.

In using the coating process of the invention, there is obtained by appropriate regulating of the heating zone and by preheating the carrier gas flowing in from below, a particle layer with the desired fluidization and temperature without temperature gradients in the particle layer. With a sufficiently large entrance speed for the coating gas, this penetrates into the upper zone of the fluidized layer and produces a uniform, qualitative, highly valuable carbon layer on the fluidized particles. By choosing an exothermic coating gas, the heat set free is sufficient to heat up the cold entering gases. Thus there results the coating of the heavy metal particles in a fluidized bed which has practically no temperature gradients in the entire fluidized bed volume.

Besides since the coating only takes place in the uppermost zone of the fluidized layer and the decomposition products arising from the coating gas are removed from the fluidized layer immediately with the carrier gas, there is formed in the reaction zone itself by the process of the invention only a very small concentration gradient.

The coating of the individual particles takes place, therefore, only in a coating zone having constant temperature and concentration, i.e., under constant coating conditions. The uniformity of the coating of all particles is attained by equal long residence times in the coating zone which are guaranteed by sufficient turbulence of the particle charge on account of corresponding regulation of the carrier gas.

A further advantage results from coating according to the invention in that the polygonity of the coated particles is very small, since the coating only takes place in the zones of greatest bed width the fluidization.

The susceptibility to disturbance of the coating in the process of the invention is vanishingly small. Since, the coating only takes place in the upper zones of the fluidized layer and the decomposition products formed are led off immediately with the carrier gas, there is not possible a growth nor deposition of carbon on either the bottom or on the walls of the particle bed.

As a result the coating plant is always ready for insertion and the carrying out of the process can be shaped toward the optimal industrial viewpoint. Thereby, it is possible to carry through large series of coating charges in a plant at constant temperature and without great overhaul work.

A decisive advantage of the process of the invention also is in that one can arrive at a simpler construction of the plant, compared to conventional plant, and therewith to a simpler operation. As a result through elimination of the cooling system and coating gas introduction at the bed bottom, this has a simple form and can be easily completed and installed axially on occasion jointly with the reaction or heating tube. Also the employing of the plant is possible in a simple way through the bottom. It is especially advantageous to concentrate the coating gas nozzles up to the fluidized zone and during the coating process according to the expansion in volume of the coated particles, drawing the coating gas off axially upwardly. The process and apparatus of the invention are especially suited for insertion in a plant in which the operation must be with active materials from the reprocessing of burned up fuel elements under remote control in "hot cells".

FIG. 1 of the drawing is a sectional view of one form of the apparatus of the invention.

Figure 1:
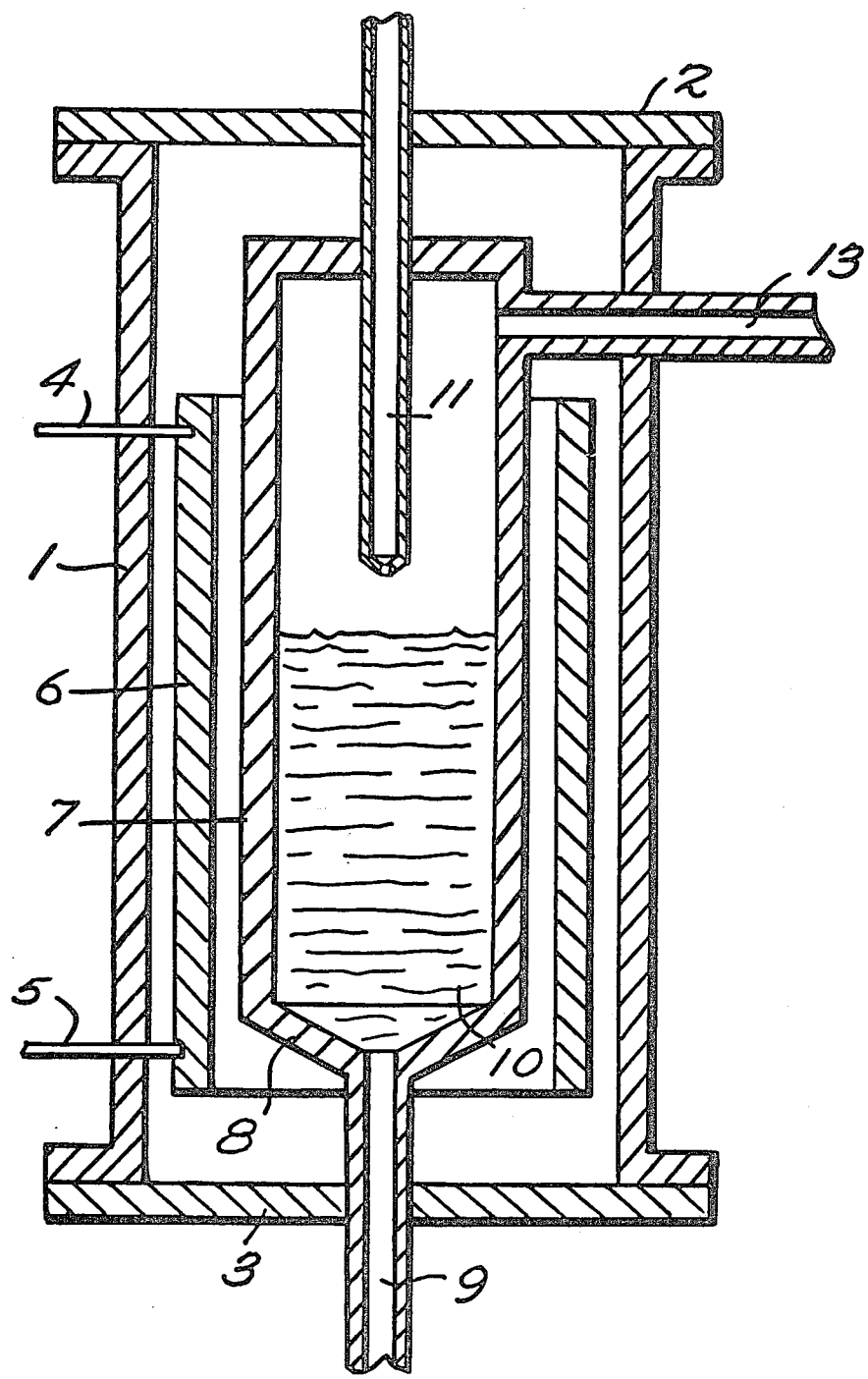

Unless otherwise indicated all parts and percentages are by weight.

The process and apparatus of the invention are described in greater detail in the following examples.

EXAMPLE 1

A 3 kg. $ThO_2$-kernel charge with an average kernel diameter of 600 μm was coated with carbon in the coating plant illustrated in the drawing.

This plant consisted of a water cooled cylindrical container 1 manufactured of $V_2A$-steel. It is sealed off in gas tight manner at the top and bottom with flanges 2 and 3. The measurement of the temperature takes place by way of a laterally fitted sight glass support. Between the power supplies 4 and 5 there is located the heat conductor tube 6. The graphite reaction tube 7 is concentrically disposed in the heat conductor tube 6 which is closed at the bottom by a heatable graphite cone 8 or a graphite frit.

Figure 2:
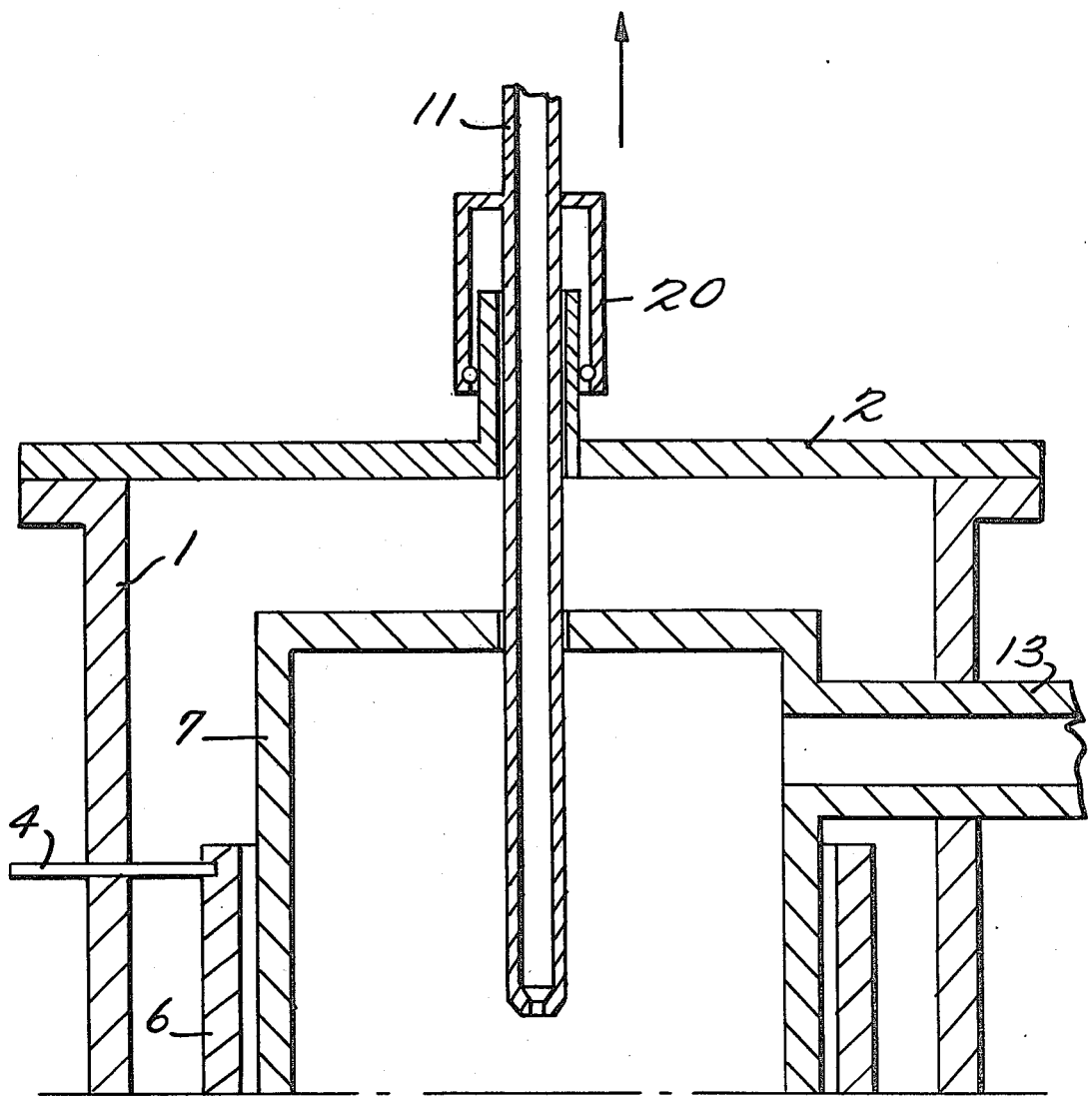
FIG. 2 is a sectional view of a modification of the apparatus of the invention, as described in FIG. 1.
Figure 3:
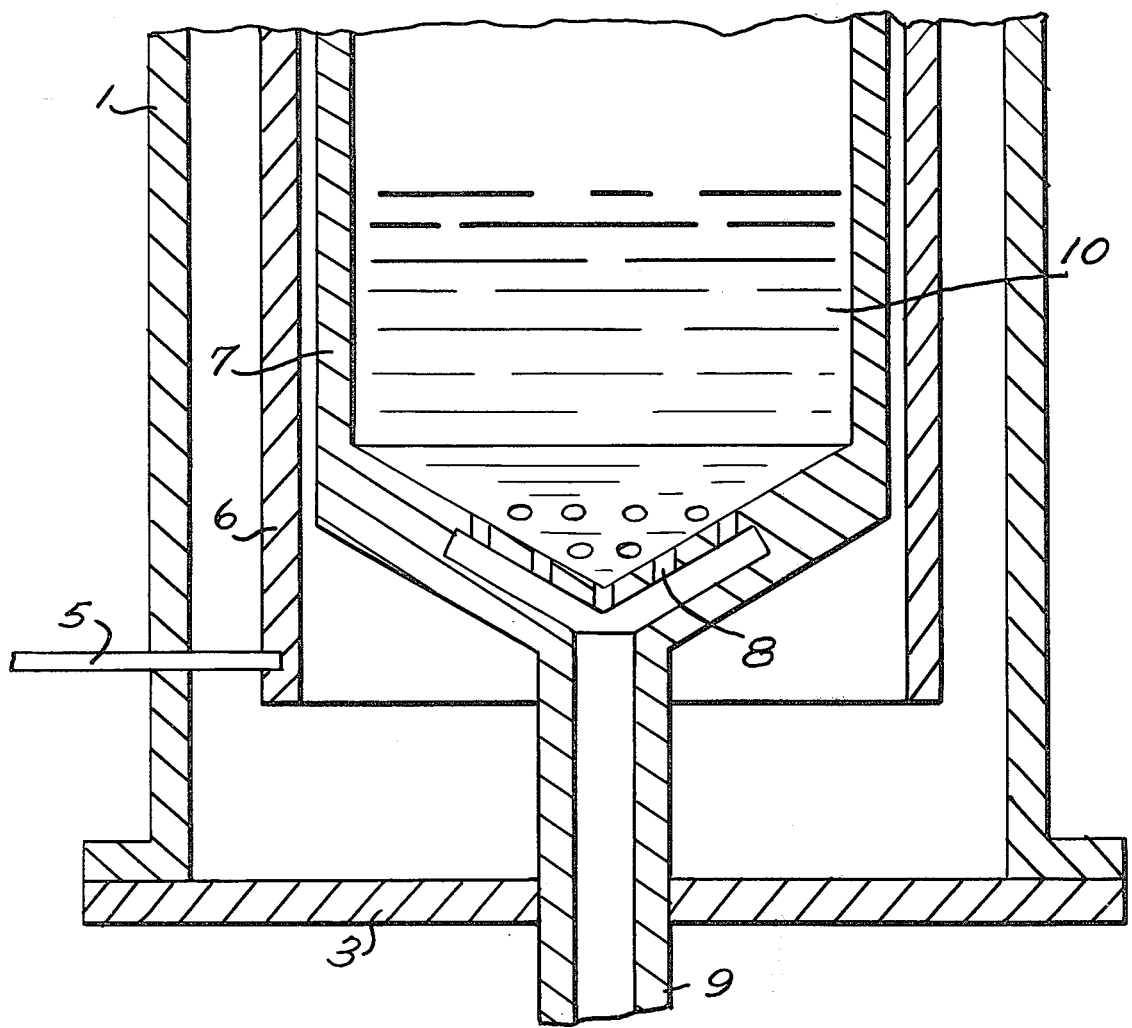
FIG. 3 is a sectional view of an alternative embodiment of the apparatus of the invention, as described in FIG. 1.

In the apertured bottom of the cone as in FIG. 3, provided with a multiplicity of openings 8 as shown in FIG. 3, in fact the cone actually used contained 17 openings there is blown through the gas inlet line 9 argon as a carrier gas into the reaction space containing the fluidized layer 10 and thereby the fluidization of the particles is maintained. Propylene is blown in as coating gas from above through a water cooled nozzle 11 to a point immediately before the fluidized bed upper surface. With increasing bed volume during the coating, the nozzle 11 is continuously withdrawn upwardly via 20, which is schematically represented in FIG. 2 as a rack. The carrier gas and the gaseous as well as some solid products of the reaction of coating gas leave through conduit 13.

The coating takes place at normal pressure at a temperature of 1400° C. There were blown into the coating bed from below 4.5 m³ of argon per hour at a velocity of 3, 2 meters/min. in the bed. The fluidized bed had a diameter of 130 mm. The coating gas, propylene, was blown into the bed through the water cooled, insulated nozzle with a nozzle opening of 2 mm from above at a rate of 2.7 m³/hour and a velocity of about 15,000 meters/minute in the nozzle opening. The following results were produced.

(a) density of the coating 1.95 g × cm$^{-3}$
(b) thickness of the coating 60 μm
(c) growth rate 120 μm/hour

EXAMPLE 2

3 kg of ThO$_2$-kernels with an average diameter of 600 μm were coated with carbon prepared by the pyrolysis of propene in the above described fluidized bed at a total pressure of 400 mm Hg at 1400° C. As carrier gas there were blown into the fluidized bed from below 1.5 m³/h of argon at a velocity of 2, 1 meters/min. in the bed. The coating gas, propene (2.7 m³/h) was blown into the bed from above through an insulated, water cooled nozzle at a velocity of about 15,000 meters/min. in the nozzle opening. The following results were obtained.

(a) density of the layer; 1.95 g/cm$^{-3}$
(b) density of the coating; 60 μm
(c) rate of growth; 150 μm/h$^{-1}$ In place of the thorium oxide there can be employed uranium oxide, thorium carbide, uranium carbide, plutonium oxide, plutonium carbide, boron carbide, boronated graphite, hafnium carbide, gadolinium oxide, samarium oxide, europium oxide or mixtures of them.

The coating gas as stated has a higher velocity than the carrier gas. Thus, the coating gas velocity in the nozzle opening is usually 1000 to 10,000 times higher than that of the carrier gas in the bed.

In several applications of the invention, the coating gas preferably is diluted with inert gas when streaming through the nozzle. Up to 90% by volume of the coating gas can be replaced by an inert gas which can be the same as the carrier gas used or can be one different from this but one of the group used as carrier gas as mentioned above.

Figure 4:
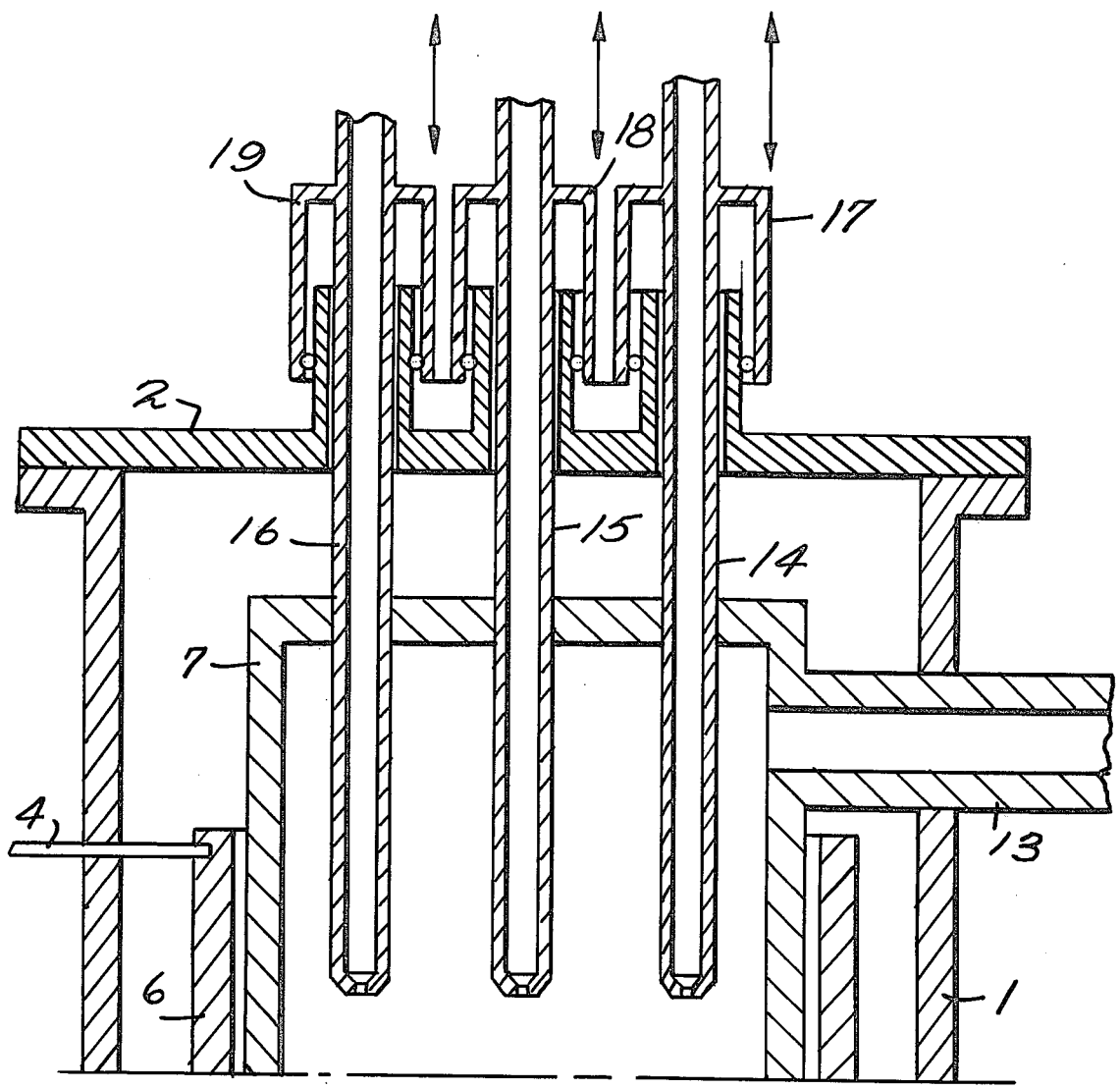
FIG. 4 is a sectional view of a modification of the apparatus of the invention, as described in FIG. 2.

Instead of one inlet nozzle 14, 15 and 16 as shown in FIG. 4, several nozzles preferably can be provided in a larger reaction tube if the inner diameter of the tube is larger than 150 mm. Several inlet supply means for coating gas extend parallel from the top into the reaction tube and terminate each in a nozzle above the fluidized bed of particles. Means 17, 18 and 19, as shown in FIG. 4 are provided for adjusting the axial position of each of said several nozzle to remain above said fluidized bed as the bed expands during the coating. Usually one nozzle is provided per 100 – 700 cm² sectional area of the reaction tube.

What is claimed is:

1. An apparatus for coating particles of a member of the group consisting of fuel, fertile material and absorber materials comprising
    a vertically positioned reaction tube, the bottom of which is cone-shaped, containing a fluidized bed of said particles,
    an inlet means to said tube for carrier gas to maintain said bed in fluidized condition, said inlet being below said bed,
    a gas outlet means from said reaction tube and above said bed,
    at least one inlet supply means for coating gas terminating in a nozzle above said fluidized bed, and
    means for retracting said nozzle so that it remains above said bed as the bed expands during the coating.

2. An apparatus according to claim 1 wherein the nozzle terminates below the gas outlet means.

3. An apparatus according to claim 2 wherein the reactor tube is made of graphite.

4. An apparatus according to claim 1 including a cylindrical container spaced from said reaction tube, surrounding said tube and concentric therewith, and heating means between said container and said tube.

5. An apparatus according to claim 1 containing several inlet supply means for coating gas extending parallel from the top into the reaction tube and terminating each in a nozzle above said fluidized bed whereby one nozzle is provided per 100 – 700 cm² sectional area of said reaction tube and means for adjusting the axial position of said nozzles to remain above said fluidized bed as the bed expands during the coating.

* * * * *